United States Patent
Khaddam-Aljameh

(10) Patent No.: US 11,409,499 B1
(45) Date of Patent: Aug. 9, 2022

(54) ELECTRONIC CIRCUIT FOR MULTIPLY-ACCUMULATE OPERATIONS

(71) Applicant: International Business Machines Corporation, Armonk, NY (US)

(72) Inventor: Riduan Khaddam-Aljameh, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/301,372

(22) Filed: Mar. 31, 2021

(51) Int. Cl.
*G06F 7/00* (2006.01)
*G06F 15/00* (2006.01)
*G06F 7/62* (2006.01)
*H03B 19/14* (2006.01)
*H03B 19/10* (2006.01)

(52) U.S. Cl.
CPC ............... *G06F 7/62* (2013.01); *H03B 19/10* (2013.01); *H03B 19/14* (2013.01)

(58) Field of Classification Search
CPC ............ G06F 7/62; H03B 19/10; H03B 19/14
USPC .......................................................... 708/200
See application file for complete search history.

(56) References Cited

U.S. PATENT DOCUMENTS

| | | | | |
|---|---|---|---|---|
| 5,708,395 | A * | 1/1998 | Yamauchi | H03L 7/0991 331/25 |
| 7,444,529 | B2 * | 10/2008 | Matsuoka | G06F 1/3203 713/323 |
| 2012/0261555 | A1 | 10/2012 | Koh | |
| 2020/0059239 | A1 | 2/2020 | Deutscher | |

FOREIGN PATENT DOCUMENTS

WO    WO 2016/187479    11/2016

OTHER PUBLICATIONS

Gülden, et al., "A Novel Current-Controlled Oscillator-Based Low-Supply-Voltage Microbolometer Readout Architecture", Journal of Circuits, Systems and Computers, vol. 29, No. 10, 2050169 (2020), 15 pages, <https://www.worldscientific.com/doi/abs/10.1142/S0218126620501698>.

Raghunandan, et al., "Linear Current-Controlled Oscillator for Analog to Digital Conversion", Proceedings of the IEEE 2014 Custom Integrated Circuits Conference, 4 pages, <https://ieeexplore.ieee.org/document/6946121>.

Shafiee, et al., "ISAAC: A Convolutional Neural Network Accelerator with In-Situ Analog Arithmetic in Crossbars", 2016 ACM/IEEE 43rd Annual International Symposium on Computer Architecture, pp. 14-26.

* cited by examiner

*Primary Examiner* — Richard Tan
(74) *Attorney, Agent, or Firm* — Michael A. Petrocelli

(57) ABSTRACT

An electronic circuit and a method of making the same includes a multiplier circuit configured to perform a multiplication of a first input signal with a second input signal. The first input signal is a binary input signal that includes a sequence of input bits. The electronic circuit further includes an oscillator circuit configured to receive a result signal of the multiplication from the multiplier and to provide output pulses having an output frequency which is dependent on the result signal of the multiplication and a digital counter circuit configured to count the output pulses. The digital counter circuit is configured to provide a plurality of counter bits and to select one of the plurality of counter bits for incrementation in dependence on a significance of the corresponding input bit of the sequence of input bits.

18 Claims, 6 Drawing Sheets

US 11,409,499 B1

ELECTRONIC CIRCUIT FOR MULTIPLY-ACCUMULATE OPERATIONS

BACKGROUND

The present invention generally relates to the field of electronic circuits, and more particularly to an electronic circuit for performing a multiply-and-accumulate operation.

Multiply-and-accumulate operations are widely used in various computing applications, in particular digital signal processing. The multiply-and-accumulate operation computes the product of two numbers/values and adds that product to an accumulator.

Computational memory can be used to perform efficient O(1) matrix-vector multiplications at the location of the data. Such computational memory can include resistive elements. The conductance values of the resistive elements are arranged in a crossbar and used to store the elements of a matrix. The matrix-vector multiplication may be achieved by reading the devices with read voltage pulses proportional to the vector values and then monitoring the resulting current along each column. An existing approach for matrix-vector multiplication suggests using the distributive law, i.e., the multi-bit input values are applied bit-wise on the crossbar and the resulting currents for each bits quantified and shifted and added according to their significance. However, this approach assumes primarily the usage of voltage-based analog-to-digital converter (ADC), and therefore it is bound to using dedicated shift and add circuits or variable area-intensive analog current-mirrors.

SUMMARY

According to an aspect, the invention is embodied as an electronic circuit including a multiplier circuit configured to perform a multiplication of a first input signal with a second input signal, the first input signal is a binary input signal including a sequence of input bits. The electronic circuit further includes an oscillator circuit configured to receive a result signal of the multiplication from the multiplier circuit and to provide output pulses having an output frequency which is dependent on the result signal of the multiplication and a digital counter circuit configured to count the output pulses. The digital counter circuit is configured to provide a plurality of counter bits and to select one of the plurality of counter bits for incrementation in dependence on a significance of the corresponding input bit of the sequence of input bits.

According to another aspect, the invention is embodied as a method for performing a multiply-and-accumulate operation. The method includes the steps of performing, by a multiplier circuit, a multiplication of a first input signal with a second input signal, the first input signal is a binary input signal including a sequence of input bits. The method further includes the steps of receiving, by an oscillator circuit, a result signal of the multiplication from the multiplier, providing, by the oscillator circuit, output pulses having an output frequency which is dependent on the result signal of the multiplication and counting, by a digital counter circuit, the output pulses. Further steps include providing, by the digital counter circuit, a plurality of counter bits and selecting, by the digital counter circuit, one of the plurality of counter bits for incrementation in dependence on a significance of the corresponding input bit of the sequence of input bits.

According to another aspect a design structure is provided. The design structure is tangibly embodied in a machine readable medium for designing, manufacturing, or testing an integrated circuit. The design structure includes an electronic circuit according to the first aspect mentioned above.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Figure 1:
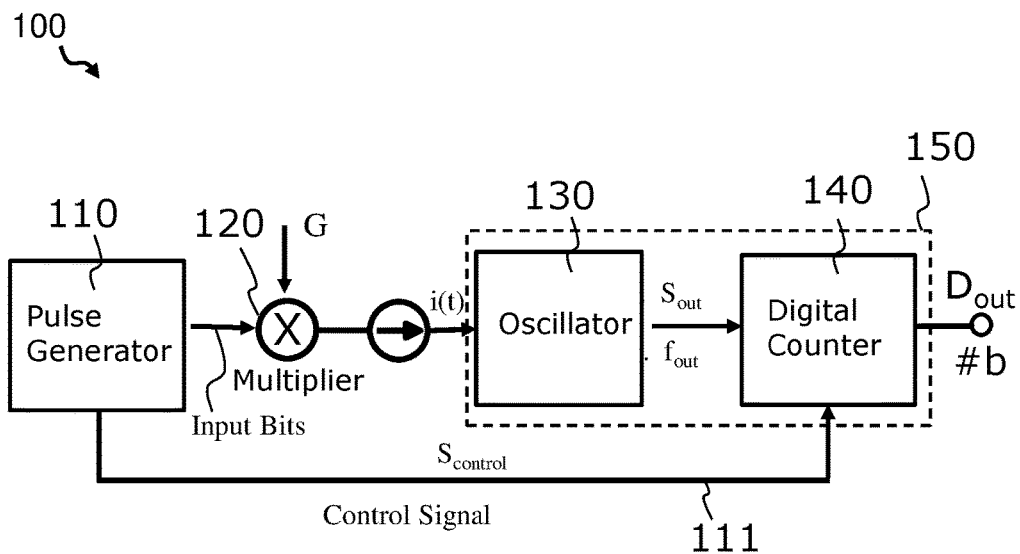
FIG. 1 is a simplified schematic block diagram of an electronic circuit, according to an embodiment of the present invention.

Referring now to FIG. 1, a simplified schematic block diagram of an electronic circuit 100 is shown, according to an embodiment of the present invention. The electronic circuit 100 includes a pulse generator 110 for generating binary pulses, in particular binary voltage pulses. The binary voltage pulses are fed as first input signal to a multiplier circuit 120. The multiplier circuit 120 is configured to perform a multiplication of the first input signal (the binary voltage pulses) with a second input signal. The binary voltage pulses establish a binary input signal including a sequence of input bits. The second input signal of the multiplier circuit 120 may in particular be embodied as a conductance value G of a resistive element. The conductance value G may be programmed with corresponding programming pulses before the execution of the multiplication. As a result of the multiplication the multiplier circuit 120 provides a result signal, in particular a current i(t), to an oscillator circuit 130. The oscillator circuit 130 may be embodied as a current controlled oscillator circuit. The oscillator circuit 130 provides as output signal $S_{out}$ output pulses with an output frequency $f_{out}$ which is dependent on the result signal of the multiplier circuit 120, i.e. the current i(t) in case of the current controlled oscillator. The electronic circuit 100 further includes a digital counter circuit 140 which is configured to count the output pulses of the output signal $S_{out}$. The digital counter circuit 140 serves as an integrator for the time encoded information of the current i(t). The digital counter circuit 140 provides a digital output signal $D_{out}$ including a digital representation of the number of pulses #b.

The pulse generator 110 is coupled to the counter circuit 140 via a control connection 111. The pulse generator 110 provides control signals $S_{control}$ via the control connection 111 to the digital counter circuit 140. The control signals $S_{control}$ may include information on the significance of the current bit of the sequence of input bits which is provided by the pulse generator 110 to the multiplier circuit 120. The digital counter circuit 140 provides a plurality of counter bits and selects one of the plurality of counter bits for a respective incrementation in dependence on the significance of the corresponding input bits. In other words, the digital counter circuit 140 sets the current counter bit to be incremented based on the significance on the current input bit. Hence, the digital counter circuit 140 is a counter with a variable selection of the incremented bit.

The oscillator circuit 130 and the digital counter circuit 140 establish together an analog-to-digital converter (ADC) 150. By providing the digital counter 140 with a variable selection of the incremented bit, the ADC 150 provides an integrated shift-and-add operation to perform the multiply-and-accumulate operation of the electronic circuit 100 in a highly efficient manner. More particularly, according to embodiments of the present invention, the shift-and-add operation can be performed at low area and zero-time cost.

In some embodiments, the digital counter circuit 140 may be an asynchronous ripple counter. Such an asynchronous ripple counter provides advantages in terms of space and speed. The asynchronous ripple counter may include a plurality of flips-flops. Through multiplexing of the inputs to the plurality of flip-flops, the increment size of the asynchronous ripple counter may be varied, thereby allowing shift-and-add operations to be performed with the ADC 150.

According to other embodiments, the digital counter circuit 140 may be a synchronous counter.

The oscillator circuit 130 may be embodied as a charge quantization circuit configured to perform a charge quantization of the input current i(t). The oscillator circuit 130 may include, for example, one or more integration capacitors which are charged by the input current and de-charged during a plurality of charge/discharge cycles. The charge quantization circuit may then provide a pulse signal per charge/discharge cycle to the counter circuit 140 and the counter circuit 140 may then count the plurality of charge/discharge cycles.

Figure 2:
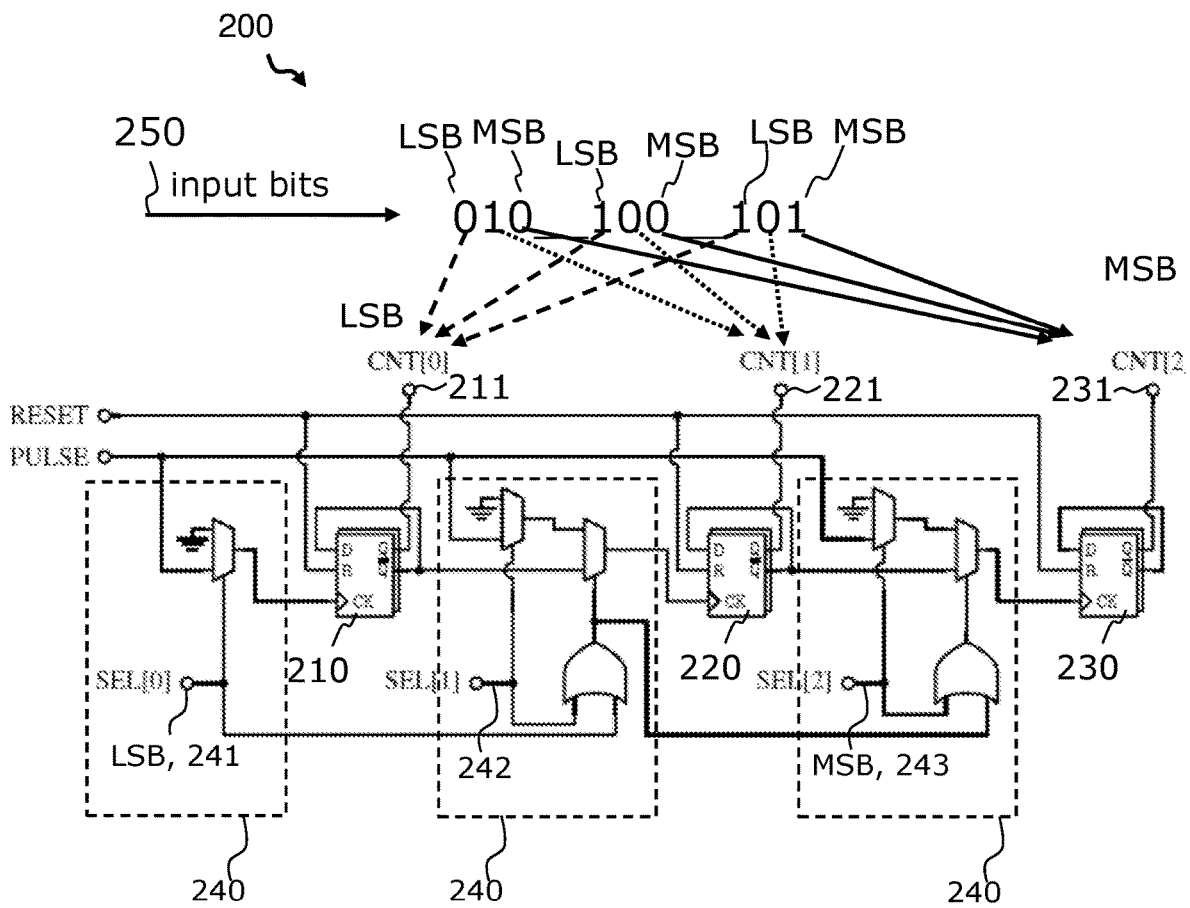
FIG. 2 is a simplified schematic block diagram of a digital counter circuit, according to an embodiment of the present invention.

Referring now to FIG. 2, a simplified schematic block diagram of a digital counter circuit 200 is shown, according to an embodiment of the present invention. The digital counter circuit 200 includes three (3) flips-flops 210, 220 and 230. Each of the flip-flops 210, 220 and 230 is configured to provide one counter bit of the counter circuit 200. More particularly, the flip-flop 210 provides a counter bit 211, the flip-flop 220 a counter bit 221 and the flip-flop 230 a counter bit 231. The flip-flops are embodied as D-Flip-flops and each include a clock input CK, a reset input R, a D-input D, a Q-output Q and an inverse $\overline{Q}$-output $\overline{Q}$. Each of the flip-flops 210, 220 and 230 may be reset by a RESET-signal. Furthermore, the output signal $S_{out}$ of the oscillator circuit 130 may be fed via a select logic 240 to the clock inputs CK. The select logic 240 includes select inputs 241, 242 and 243 for selecting the corresponding flip-flop in dependence on the significance of the input bit. The select inputs may be selected by means of the control signal $S_{control}$.

FIG. 2 also shows an exemplary sequence of input bits 250. The sequence of input bits 250 includes three (3) input values 010, 100 and 101. Each of the input values is represented by three bits. The first bit of each input value is assumed to be the least significant bit LSB and the last bit of each input value is assumed to be the most significant bit MSB. In order to perform the shift-and-accumulate operation or in other words the shift-and-add operation in accordance with the respective significance of the input bits, the select logic 240 selects the corresponding flip-flop depending on the significance of the input bits. More particularly, for the LSB-input bits, the select logic 240 selects the flip-flop 210 by means of a select signal SEL[0] to the select input LSB, 241. Furthermore, for the MSB-input bits, the select logic 240 selects the flip-flop 230 by means of a select signal SEL[2] to the select input MSB, 243. And, for the intermediate-input bits, the select logic 240 selects the flip-flop 220 by means of a select signal SEL[1] to the select input 242. The input bits are traversed from LSB to MSB in this specific implementation. After the selection of the particular input-bit, the multiplier circuit 120 is activated and the oscillator circuit 130 produces an output signal, with a product-proportional frequency, that is fed into the PULSE input of the digital counter circuit 140 for a fixed period of time. Afterwards the pulse generator proceeds to the next input-bit until all 3-bits of the input value are processed. Due to the modular design the counter size can be extended by adding more of the counter flip-flops 210 and optionally also select logic blocks 240, if needed.

Figure 3:
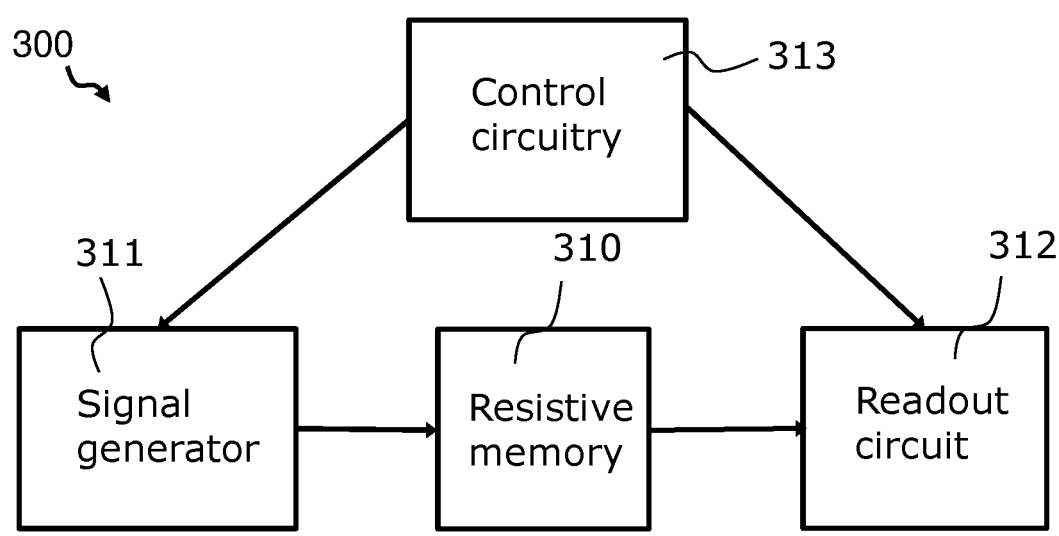
FIG. 3 is a simplified schematic block diagram of a device for performing a multiplication of a matrix with a vector, according to an embodiment of the present invention.

Referring now to FIG. 3, a schematic block diagram of a device 300 for performing a multiplication of a matrix with a vector is shown, according to an embodiment of the present invention. The device 300 includes a resistive memory 310 having a plurality of resistive elements. Furthermore, a signal generator 311 is provided. The signal generator 311 is configured to apply electrical programming signals to the resistive elements of the resistive memory 310. The signal generator 311 includes circuitry for programming the resistive elements during data write or programming operations such that a multiplication of a matrix with a vector can be performed. The row lines and column lines may also be denoted as word and bit lines. The signal generator 311 is configured to receive a matrix A as input and to apply programming signals to the resistive elements to program conductance values of the resistive elements for a matrix-vector multiplication.

The conductance values represent matrix values of the matrix that will be multiplied with the vector.

In addition, the device 300 includes a readout circuit 312 configured to read out resistance values of the resistive elements during data read operations. The device 300 is configured to apply read out voltages to the rows of the memory crossbar array. The readout voltages represent vector elements of the vector that will be multiplied with the matrix. The device is further configured to read out current values of columns of the memory array. The current values represent result values of vector elements of a result vector of the multiplication.

The device 300 further includes control circuitry 313 configured to control the signal generator 311 and the readout circuit 312.

According to an embodiment, a resistive element may be defined as an element whose electrical resistance can be changed by applying an electrical programming signal to the resistive element. The resistive element may particularly be embodied as resistive memory element. The electrical programming signal may be, e.g., a current flowing through the resistive memory element, or an electrical voltage applied to the resistive memory element. The current and/or voltage may be, e.g., applied to the resistive memory element in the form of pulses. As a result, the electrical resistance of a resistive memory element depends on the history of current that had previously flown through the memory element and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g., a chalcogenide. These resistive memory elements exhibit good performance in terms of power consumption, integration density potential, retention, and endurance.

The memory 310 may be in particular embodied as phase change memory (PCM). To perform a matrix-vector multiplication, the resistive memory elements, e.g., the PCM cells, are programmed according to embodiments in a type of write operation. More particularly, the signal generator 311 applies a voltage to the cell via the column lines and row lines such that the resulting programming signal sets the cell to a state (conductance value) that represents a matrix element of the matrix that will be multiplied with the vector. In a read operation, (lower) read voltages are applied to the row lines. Then the resulting column current values of the column lines are read/measured to obtain the result vector.

Figures 4A, 4B:
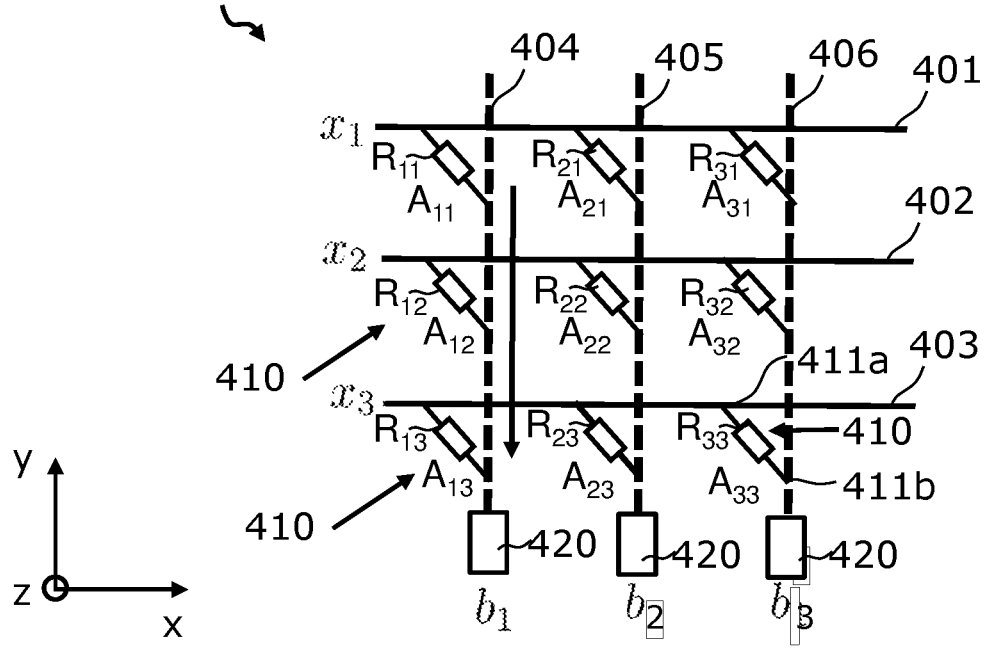
FIGS. 4A-4B illustrates an example of a matrix multiplication, according to an embodiment of the present invention.

Referring now to FIGS. 4A-4B, an example of a matrix multiplication is shown, according to an embodiment of the present invention. The matrix multiplication uses Ohm's law and Kirchhoff's law in a resistive memory crossbar array.

According to the illustrated example of FIG. 4A, a matrix multiplication operation 400A includes a matrix A of size 3×3 that is multiplied with a vector x and the result is a product or result vector b:

$$\begin{bmatrix} A_{11} & A_{12} & A_{13} \\ A_{21} & A_{22} & A_{23} \\ A_{31} & A_{32} & A_{33} \end{bmatrix} \begin{bmatrix} x_1 \\ x_2 \\ x_3 \end{bmatrix} = \begin{bmatrix} b_1 \\ b_2 \\ b_3 \end{bmatrix}$$

Accordingly, the matrix A includes a first column consisting of the matrix elements $A_{11}$, $A_{21}$ and $A_{31}$, a second column consisting of the matrix elements $A_{12}$, $A_{22}$ and $A_{32}$ and a third column consisting of the matrix elements $A_{13}$, $A_{23}$ and $A_{33}$. The vector x includes the vector elements $x_1$, $x_2$ and $x_3$.

For the multiplication of the matrix A with the size 3×3, the resistive memory 310 includes a memory crossbar array 400B of a corresponding size 3×3, as illustrated in FIG. 4B.

As depicted in FIG. 4B, the memory crossbar array 400B includes three row lines namely 401, 402, and 403 and three column lines namely 404, 405 and 406. The three row lines 401, 402 and 403 are arranged above the three column lines 404, 405 and 406 which is indicated by dotted lines. More particularly, the row lines 401, 402 and 403 extend in a first x-y-plane and the three column lines extend in a second x-y plane; the first x-y plane is arranged in the vertical z-direction above the second x-y plane. The memory crossbar array 400B establishes a crossbar-based multiplier which represents a more detailed embodiment of the multiplier circuit 120 of FIG. 1.

The three row lines 401, 402 and 403 and the three column lines 404, 405 and 406 are connected to each other via vertical junctions 410. The junctions 410 extend in the vertical z-direction between upper cross points 411a of the row lines 401-403 and lower cross points 411b of the column lines 404-406.

Each junction 410 includes a serial arrangement of a resistive memory element and a transistor. For ease of illustration, the transistors are not shown in FIG. 4B.

More particularly, the crossbar array 400B includes nine (9) resistive memory elements embodied as PCM cells. The column line 404 includes resistive memory elements $R_{11}$, $R_{12}$ and $R_{13}$, the column line 405 includes the memory elements $R_{21}$, $R_{22}$ and $R_{23}$ and the column line 406 the memory elements $R_{31}$, $R_{32}$ and $R_{33}$.

In order to perform the matrix vector multiplication of the above matrix, the signal generator 11 applies programming signals, in particular current pulses, to the resistive memory elements and thereby programs the conductance values for the matrix-vector multiplication.

More particularly, the conductance values of the resistive memory elements represent matrix values of the matrix of the matrix-vector multiplication. Accordingly, the conductance of the resistive memory element $R_{11}$ is programmed to the matrix value $A_{11}$, the conductance of the resistive memory element $R_{12}$ is programmed to the matrix value $A_{12}$, or more generally the conductance of the resistive memory Rij is programmed to a corresponding matrix value Aij.

Then the readout circuit 312 applies read voltages to the row lines 401, 402 and 403. More particularly, the readout circuit 312 applies a read voltage $X_1$ to the row line 401, a read voltage $X_2$ to the row line 402 and a read voltage $X_3$ to the row line 403. Hence the read voltages represent vector values of the vector of the matrix-vector multiplication.

Furthermore, the readout circuit 312 reads out current values of the column lines 404, 405 and 406. As an example, the readout circuit 312 reads out a current value $b_1$ from the column line 404, which is the sum of three multiplications, namely $b_1 = A_{11}x_1 + A_{12}x_2 + A_{13}x_3$.

Accordingly, the readout circuit 312 reads out a current value $b_2$ from the column line 405 and a current value $b_3$ from the column line 406. The current values represent the result values of the vector elements of the product vector b.

According to embodiments of the present invention, the column lines 404, 405 and 406 include at its output measuring circuitry 420 for measuring the current values $b_1$ $b_2$ and $b_3$. The measuring circuitry 420 may be embodied, e.g., by an oscillator circuit 130 and a digital counter circuit 140 as described above.

Figure 5:
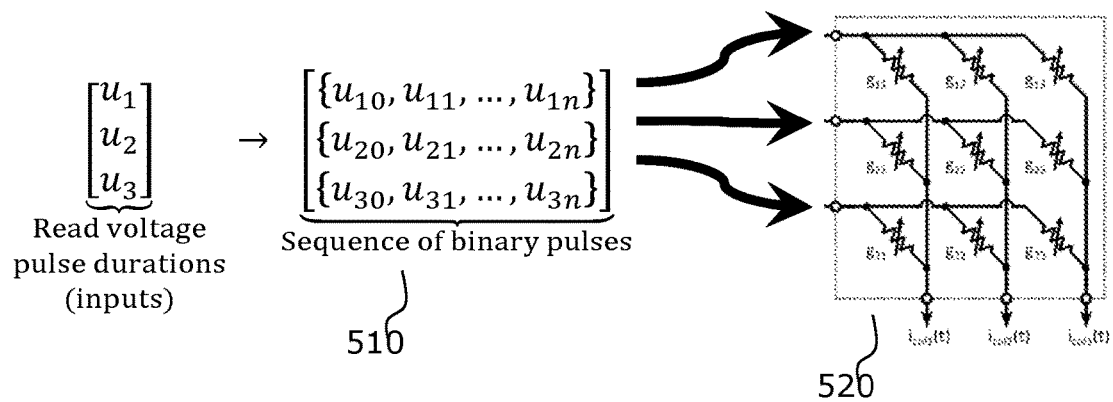
FIG. 5 illustrates the application of binary read voltage pulses to a crossbar, array according to an embodiment of the present invention.

Referring now to FIG. 5, the application of read voltage pulses to a crossbar array is shown, according to an embodiment of the present invention. According to this embodiment, the application of the input vector happens through read voltage pulse modulation. The elements of an input vector $\vec{u}$ are mapped to pulse durations of read pulses. More particularly, the amplitude of the applied read voltages is fixed, while the width of the read pulses is modulated in dependence on the respective read voltage. This provides the advantage that non-linearities in the current voltage (IV curve) of the resistive elements of the crossbar array are avoided.

According to this embodiment, the input pulse durations are modulated bit-wise, and hence a sequence of binary pulses includes n binary pulses being applied to each of the row lines of the crossbar array. More particularly, for a n-bit quantization of the read voltages n-analog multiplications with binary values are performed. This provides the advantage that there is no exponential time penalty due to the pulse-width modulation. At the output of the column lines, column current signals $i_{col1}(t)$, $i_{col2}(t)$ and $i_{col3}(t)$ are detected, in particular integrated.

Hence, devices according to embodiments of the present invention may be configured to apply the read voltages as binary read pulse vectors to the row lines of the crossbar array. According to embodiments, the input signal may consist of a digital input vector, which is to be multiplied with the values stored in the resistive elements of the crossbar array.

Using binary D/As the n bit input values can be mapped to a sequence of n binary read pulse vectors which are applied to the crossbar array from which n currents are read, digitized and added thus yielding the result of the matrix-vector multiplication. Each current quantized per sequence is a DC quantity and does not change during digitization.

As illustrated in FIG. 5, the multi-bit input values are applied bit-wise on the crossbar.

According to embodiments of the invention, the column current signals $i_{col1}(t)$, $i_{col2}(t)$ and $i_{col3}(t)$ may be sensed, in particular quantized, by an oscillator circuit 130 and a subsequent digital counter circuit 140 as described above.

For a correct result of the multiplication, the significance of the respective input bits needs to be considered. Instead of directly performing a shift-and-add operation of the column currents, embodiments of the invention implement the shift-and-add functionality or in other words the shift-and-accumulate functionality by means of a digital counter circuit with a variable selection of the incremented bit.

Figure 6:
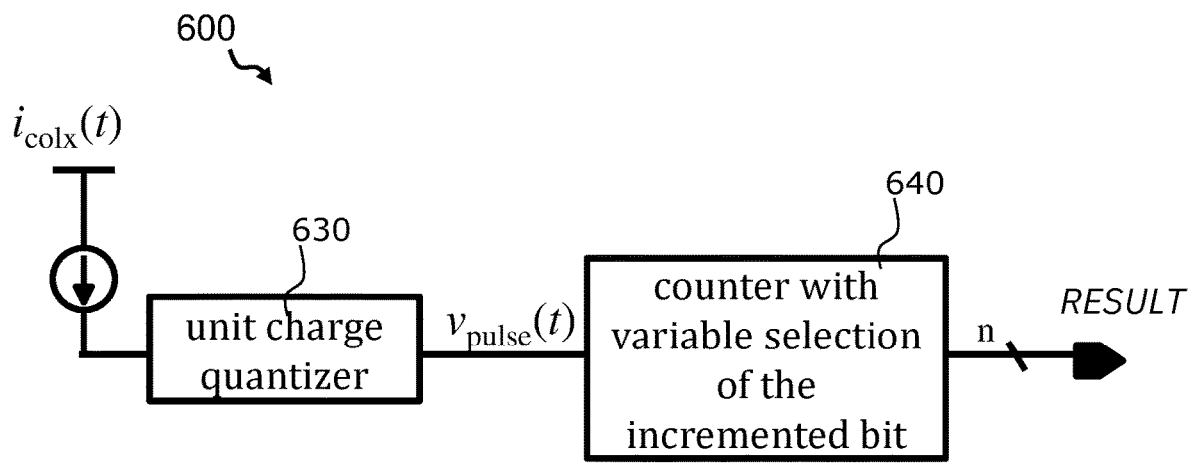
FIG. 6 illustrates the further processing of the column currents of the crossbar array of FIG. 5, according to an embodiment of the present invention.

This is illustrated with reference to FIG. 6, which shows the further processing of the column currents $i_{colx}(t)$ of the crossbar array 510 of FIG. 5.

The respective column currents $i_{colx}(t)$ are processed by a current controlled oscillator circuit 630 which is embodied as unit charge quantizer circuit configured to output pulses $v_{pulse}(t)$ each time a fixed amount of charge is detected. A digital counter circuit 640 with a variable selection of the incremented bit counts the pulses $v_{pulse}(t)$, wherein the digital counter circuit 640 selects the incremented bit in accordance with the corresponding significance of the corresponding binary pulse of the sequence of binary pulses. According to embodiment, no dedicated shift-and-add circuits are needed, and the result of the ADC can be used immediately after digitization.

The crossbar array of systems according to embodiments of the invention may include as resistive elements phase change memory (PCM) elements, conductive bridge resistive memory elements, metal-oxide resistive random access memory (RRAM) elements, magneto-resistive random access memory (MRAM) elements, ferroelectric random access memory (FeRAM) elements, optical memory elements or a system device, including transistors, resistors, capacitors, and/or inductors, jointly emulating a behavior of a resistive memory element.

Figure 7:
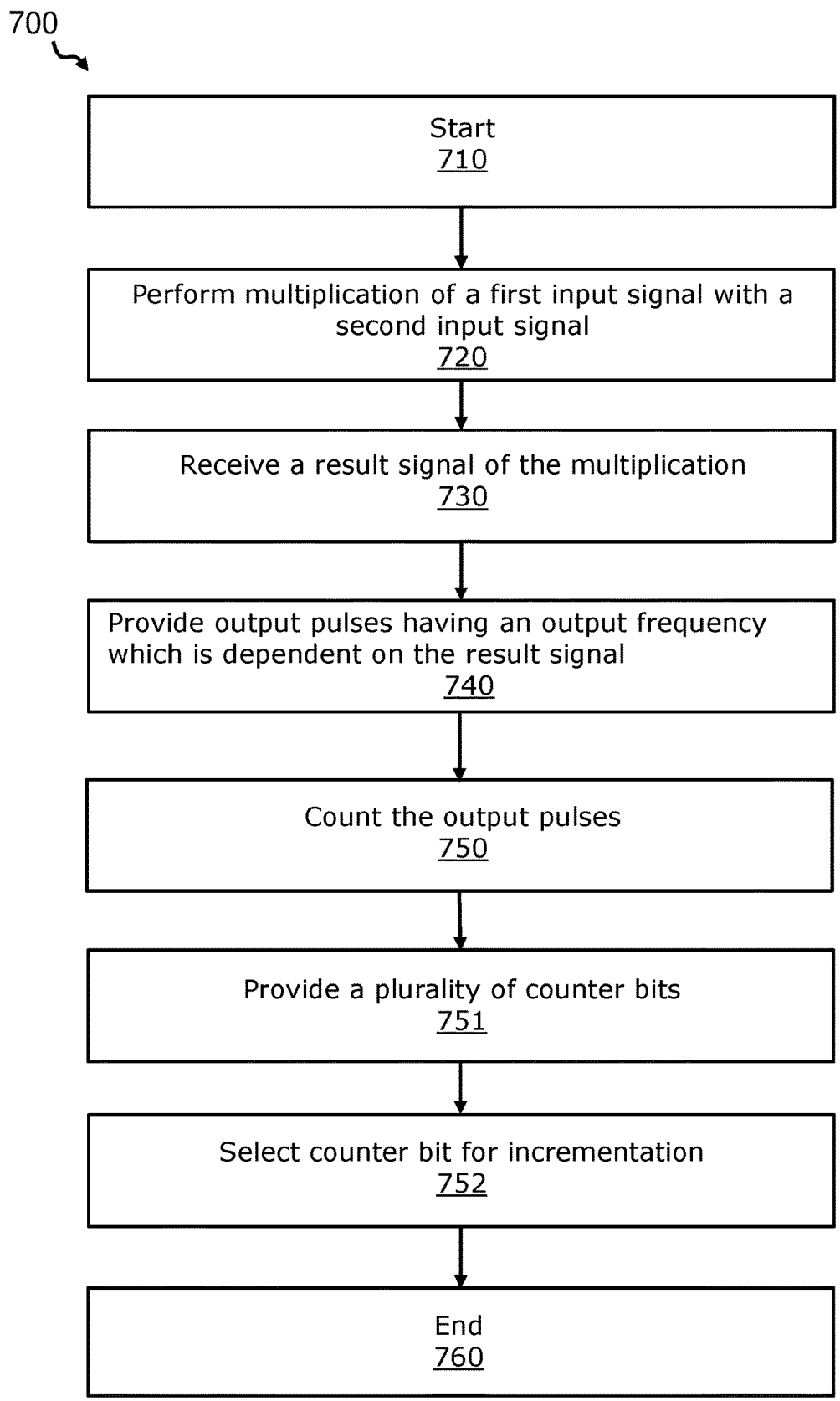
FIG. 7 is a flow chart illustrating the steps of a method for performing a multiply- and accumulate operation, according to an embodiment of the present invention.

Referring now to FIG. 7, a flow chart illustrating steps of a method for performing a multiply-and-accumulate operation is shown, according to an embodiment of the present invention.

The method may be performed by, for example, the electronic circuit 100, and it is described with reference to the components of the electronic circuit 100.

At a step 710, the method starts.

At a step 720, the multiplier circuit 120 performs a multiplication of a first input signal with a second input signal, where the first input signal is a binary input signal including a sequence of input bits.

At a step 730, the oscillator circuit 130 receives a result signal of the multiplication from the multiplier circuit 120.

At a step 740, the oscillator circuit 130 provides output pulses having an output frequency which is dependent on the result signal of the multiplication to the digital counter circuit 140. At a step 750, the digital counter circuit 140 counts the output pulses. The counting step 750 includes a sub-step 751 of providing, by the digital counter circuit 140 a plurality of counter bits and a sub-step 752 of selecting, by the digital counter circuit 140, one of the plurality of counter bits for incrementation in dependence on a significance of the corresponding input bit of the sequence of input bits.

At a step 760, the method ends.

Figure 8:
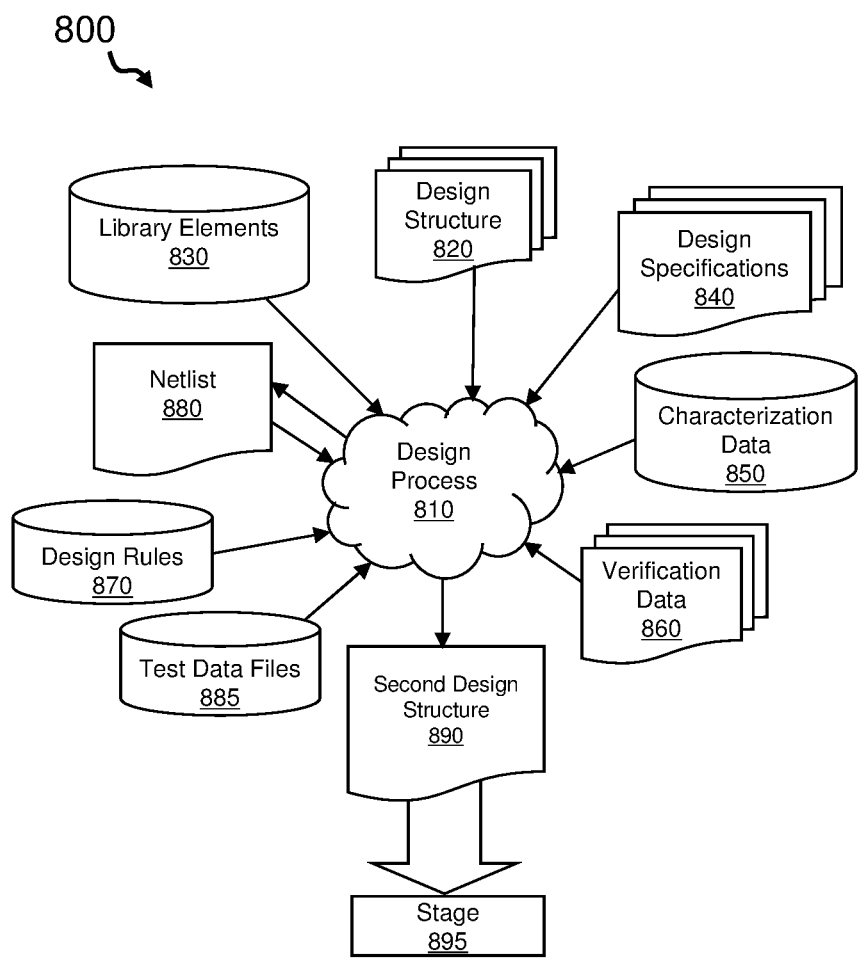
FIG. 8 shows a block diagram of an exemplary design flow, according to an embodiment of the present invention.

Referring now to FIG. 8, a block diagram of an exemplary design flow 800 used, for example, in semiconductor IC logic design, simulation, test, layout, and manufacture is shown, according to an embodiment of the present invention. Design flow 800 includes processes, machines and/or mechanisms for processing design structures or devices to generate logically or otherwise functionally equivalent representations of the design structures and/or devices described above and shown in, for example, FIGS. 1-6. The design structures processed and/or generated by design flow 800 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 800 may vary depending on the type of representation being designed. For example, a design flow 800 for building an application specific IC (ASIC) may differ from a design flow 800 for designing a standard component or from a design flow 800 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 820 that is preferably processed by a design process 810. Design structure 820 may be a logical simulation design structure generated and processed by design process 810 to produce a logically equivalent functional representation of a hardware device. Design structure 820 may also or alternatively include data and/or program instructions that when processed by design process 810, generate a functional representation of the physical structure of a hardware device. Whether representing functional and/or structural design features, design structure 820 may be generated using electronic computer-aided design (ECAD) such as implemented by a core developer/designer. When encoded on a machine-readable data transmission, gate array, or storage medium, design structure 820 may be accessed and processed by one or more hardware and/or software modules within design process 810 to simulate or otherwise functionally represent an electronic component, circuit, electronic or logic module, apparatus, device, or system such as those shown in FIGS. 1-6. As such, design structure 820 may include files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown in FIGS. 1-6 to generate a Netlist 880 which may contain design structures such as design structure 820. Netlist 880 may include, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 810 may include hardware and software modules for processing a variety of input data structure types including Netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 840, characterization data 850, verification data 860, design rules 870, and test data files 885 which may include input test patterns, output test results, and other testing information. Design process 810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 810 without deviating from the scope and spirit of the invention. Design process 810 may also include modules for performing standard circuit design processes such as timing analysis, verification, design rule checking, place and route operations, etc.

Design process 810 employs and incorporates logic and physical design tools such as HDL compilers and simulation model build tools to process design structure 820 together with some or all of the depicted supporting data structures along with any additional mechanical design or data (if applicable), to generate a second design structure 890. Design structure 890 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 890 may include a compiled, executable HDL simulation model that functionally simulates the devices shown in FIGS. 1-8.

Design structure 890 may also employ a data format used for the exchange of layout data of integrated circuits and/or symbolic data format (e.g. information stored in a GDSII (GDS2), GL1, OASIS, map files, or any other suitable format for storing such design data structures). Design structure 890 may include information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 890 may then proceed to a stage 895 where, for example, design structure 890: proceeds to tape-out, is released to manufacturing, is released to a mask house, is sent to another design house, is sent back to the customer, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While steps of the disclosed method and components of the disclosed systems and environments have been sequentially or serially identified using numbers and letters, such numbering or lettering is not an indication that such steps must be performed in the order recited, and is merely provided to facilitate clear referencing of the method's steps. Furthermore, steps of the method may be performed in parallel to perform their described functionality.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

What is claimed is:

1. An electronic circuit comprising:
a multiplier circuit for performing a multiplication of a first input signal with a second input signal, wherein the first input signal is a binary input signal comprising a sequence of input bits;
an oscillator circuit for receiving a result signal of the multiplication from the multiplier circuit and for providing output pulses having an output frequency which is dependent on the result signal of the multiplication; and
a digital counter circuit for counting the output pulses, the digital counter circuit providing a plurality of counter bits and selecting one of the plurality of counter bits for incrementation in dependence on a significance of a corresponding input bit of the sequence of input bits.

2. The electronic circuit according to claim 1, wherein the oscillator circuit is embodied as a current controlled oscillator circuit for receiving a current as the result signal.

3. The electronic circuit according to claim 2, wherein the oscillator circuit is embodied as a unit charge quantizer circuit for outputting pulses each time a fixed amount of charge is detected.

4. The electronic circuit according to claim 1, wherein the first input signal comprises binary voltage pulses.

5. The electronic circuit according to claim 1, wherein the second input signal is represented by at least one of resistance values and conductance values of one or more resistive elements.

6. The electronic circuit according to claim 1, wherein the digital counter circuit is an asynchronous ripple counter.

7. The electronic circuit according to claim 1, wherein the digital counter circuit is a synchronous counter.

8. The electronic circuit according to claim 2, wherein:
the current controlled oscillator circuit performs a plurality of charge/discharge cycles of one or more integration capacitors; and
the counter circuit counts a plurality of charge/discharge cycles of one or more integration capacitors.

9. The electronic circuit according to claim 1, wherein the counter circuit comprises:
a plurality of flips-flops, wherein each of the plurality of flip-flops is configured to provide one of the plurality of counter bits of the counter circuit; and
a select logic configured to select one of the plurality of flip-flops in dependence on the significance of the corresponding input bit.

10. The electronic circuit according to claim 1, wherein the multiplier circuit is a crossbar-based multiplier comprising a crossbar array, the crossbar array comprising a plurality of programmable resistive elements.

11. The electronic circuit according to claim 10, wherein the electronic circuit performs a matrix-vector multiplication of a matrix with a vector, wherein:
the crossbar array comprises:
a plurality of row lines;
a plurality of column lines;
a plurality of junctions arranged between the plurality of row lines and the plurality of column lines, wherein each junction comprises a programmable resistive element and an access element for accessing the programmable resistive element; and wherein the electronic circuit further comprises;
a readout circuit for applying read voltage pulses as a first input signal to a plurality of row lines of the crossbar array; and
a signal generator for applying programming signals to resistive elements to program conductance values for the matrix-vector multiplication.

12. The electronic circuit according to claim 11, wherein the readout applies the read voltage pulses as binary read pulse vectors to the plurality of row lines of the crossbar array.

13. The electronic circuit according to claim 11, wherein the programmable resistive elements are selected from the group consisting of:
Phase change memory (PCM) elements, Conductive bridge resistive memory elements, Metal-oxide resistive random access memory (RRAM) elements, Magneto-resistive random access memory (MRAM) elements, Ferroelectric random access memory (FeRAM) elements, optical memory elements, and a system device comprising transistors, resistors, capacitors, and inductors, jointly emulating a behavior of a resistive memory element.

14. A method for performing a multiply-and-accumulate operation, the method comprising:
performing, by a multiplier circuit, a multiplication of a first input signal with a second input signal, wherein the first input signal is a binary input signal comprising a sequence of input bits;
receiving, by an oscillator circuit, a result signal of the multiplication from the multiplier circuit;
providing, by the oscillator circuit, output pulses having an output frequency which is dependent on the result signal of the multiplication;
counting, by a digital counter circuit, the output pulses;
providing, by the digital counter circuit, a plurality of counter bits; and
selecting, by the digital counter circuit, one of the plurality of counter bits for incrementation in dependence on a significance of a corresponding input bit of the sequence of input bits.

15. The method according to claim 14, further comprising:
performing, by the oscillator circuit, a plurality of charge/discharge cycles of one or more integration capacitors; and
counting, by the digital counter circuit, the plurality of charge/discharge cycles of the one or more integration capacitors.

16. The method according to claim 14, wherein the method comprises:
performing a matrix-vector multiplication of a matrix with a vector by means of a crossbar array as the multiplier circuit, the crossbar array comprising:
a plurality of row lines;
a plurality of column lines; and
a plurality of junctions arranged between the plurality of row lines and the plurality of column lines, wherein each junction comprises a programmable resistive element and an access element for accessing the programmable resistive element.

17. The method according to claim 16, further comprising:
applying read voltage pulses as first input signal to the crossbar array; and
applying programming signals to the programmable resistive elements to program conductance values representative of the second input signal of the multiplier circuit.

18. A design structure tangibly embodied in a machine readable medium for designing, manufacturing, or testing an integrated circuit, the design structure comprising an electronic circuit including:
- a multiplier circuit for performing a multiplication of a first input signal with a second input signal, wherein the first input signal is a binary input signal comprising a sequence of input bits;
- an oscillator circuit for receiving a result signal of the multiplication from the multiplier circuit and for providing output pulses having an output frequency which is dependent on the result signal of the multiplication; and
- a digital counter circuit for counting the output pulses, the digital counter circuit providing a plurality of counter bits and selecting one of the plurality of counter bits for incrementation in dependence on a significance of a corresponding input bit of the sequence of input bits.

* * * * *